United States Patent [19]

Dykaar et al.

[11] Patent Number: 5,406,194
[45] Date of Patent: Apr. 11, 1995

[54] $AL_xGA_{1-x}$ AS PROBE FOR USE IN ELECTRO-OPTIC SAMPLING

[75] Inventors: Douglas R. Dykaar, Gillette; Ulrich D. Keil, Warren; Rose F. Kopf, Greenbrook; Edward J. Laskowski, Scotch Plains; George J. Zydzik, Columbia, all of N.J.

[73] Assignee: AT&T Corp., Murray Hill, N.J.

[21] Appl. No.: 948,059

[22] Filed: Sep. 21, 1992

[51] Int. Cl.⁶ ........................................... G01R 31/00
[52] U.S. Cl. ................................. 324/96; 324/117 R
[58] Field of Search .................. 324/96, 117 R, 244.1, 324/158 R, 72.5, 760, 765, 754; 359/248, 244, 245, 249; 257/184, 189; 437/107, 974, 966; 156/630

[56] References Cited

U.S. PATENT DOCUMENTS

| | | | |
|---|---|---|---|
| 3,614,451 | 10/1971 | Gunn | 250/217 |
| 4,446,425 | 5/1984 | Valdmanis et al. | 324/77 K |
| 4,618,819 | 10/1986 | Mourou et al. | 324/77 K |
| 4,681,449 | 7/1987 | Bloom et al. | 356/364 |
| 4,891,580 | 1/1990 | Valdmanis | 324/96 |
| 5,006,789 | 4/1991 | Williamson | 324/96 |

OTHER PUBLICATIONS

J. F. Whitaker et al., *External Electro-Optic Integrated Circuit Probing*, Elsevier Science Publisher, B.V. 1990, pp. 369-379.
J. A. Valdmanis et al. "Electro-Optic Sampling: . . . Part 2, Application", *Laser Focus/Electro-Optics*, Mar. 1986, pp. 96-106.
J. A. Valdmanis et al. "Electro-Optic Sampling: . . . Part I, Principles and Embodiments", *Laser Focus/Electro-Optics*, Feb. 1986, pp. 84-96.
S. B. Darack et al. "Timing-Jitter Stabilization of a Colliding-Pulse Mode-Locked Laser . . . ", *Optical Soc. of Amer.*, 1991, pp. 1677-1679.
R. B. Marcus, Editor, "Measurement of High-Speed Signals in Solid State Devices", *Academic Press, Inc.*, San Diego, Calif., 1990, pp. 209-210.

*Primary Examiner*—Vinh Nguyen
*Attorney, Agent, or Firm*—Oleg E. Alber

[57] ABSTRACT

A new electro-optic sampling probe with femtosecond resolution suitable for ultra-fast electro-optic sampling. The new probe is several times thinner and has a dielectric constant four times less than the best reported conventional bulk $LiTaO_3$ probes. In addition, the ultimate bandwidth is 50 percent greater than an equivalent $LiTaO_3$ probe. The probe is a thin film of $Al_xGa_{1-x}As$ used in both total internally reflecting and free-standing geometries. Here x is chosen for sufficient transmission of the crystal to the wavelength of the laser source being used for electro-optic sampling. The thickness of the film is a small fraction of the thickness of prior art probes and is chosen, for speed and sensitivity of electro-optic sampling, to be thin compared to the spatial extent of the laser pulse. The thin film probe eliminates many of the problems associated with the use of bulk crystals as electro-optic sensors.

14 Claims, 8 Drawing Sheets

$AL_xGA_{1-x}$ AS PROBE FOR USE IN ELECTRO-OPTIC SAMPLING

FIELD OF THE INVENTION

This invention pertains to electro-optic sampling of fast electronic and opto-electronic devices and circuits.

BACKGROUND OF THE INVENTION

Two-dimensional circuits have an open electrode structure which gives rise to fringing fields above the surface of the circuit. External electro-optic (e-o) probing techniques exploit the fringing fields to electro-optically sample fast electronic and opto-electronic devices and circuits. An e-o crystal probe placed into the fringing fields changes the crystal birefringence of the probe, which can then be measured optically by means of a pulsed light beam which is passed through the e-o crystal and is reflected from the circuit. Such external probes can be applied to almost any type of circuit, because the interaction is based on the field effect. Since no charge is removed from the circuit, the probe does not need to make an electrical contact to the circuit. Some of the electro-optic techniques and apparatus are disclosed in articles by J. A. Valdmanis and G. Mourou, "Electro-Optic Sampling: Testing Picosecond Electronics, Part 1, Principles and Embodiments", *Laser Focus/Electro-Optics*, February 1986, pages 84–96, and "Electro-Optic Sampling: Testing Picosecond Electronics, Part 2, Applications", *Laser Focus/Electro-Optics*, March 1986, pages 96–106; J. F. Whitaker et al., *External Electro-Optic Integrated Circuit Probing*, Elsevier Science Publisher, B.V. 1990, pages 369–379, and in U.S. Pat. No. 4,891,580 issued Jan. 2, 1990 to Janis A. Valdmanis.

In FIGS. 6 and 7 is shown a typical prior-art arrangement, 10, being used for optical sampling of an exemplary circuit having a plurality of conductors, 12, on a surface of a semiconductor substrate, 13. Illustratively, the substrate and conductors are part of an integrated circuit. An electro-optic (e-o) crystalline probe 15, is mounted on a transparent support, 16, forming a supported probe, 14. An end face of probe 15 is positioned over or on the conductor whose voltage waveform is to be sampled. Sampling is performed optically by short-duration pulses of a polarized light beam 17 which is directed through support 16 into probe 14. Beam 17 is typically reflected from the conductor itself, but it may also be reflected by an optional reflector 18 (shown in dashed line in FIG. 7) disposed on the end face of the probe. The latter may be desirable in cases where the circuit is sensitive to light.

In order to effect voltage measurements, the e-o crystal of probe 15 comprises a material which exhibits a longitudinal e-o effect; that is, a field-induced birefringence in response only to electric field components parallel to the direction of beam 17. Since the beam is directed perpendicularly to the surface of the conductor, only field components perpendicular to that surface induce the desired birefringence. The material itself need not have an inherent birefringence.

Sampling pulses are generated by a pulsed laser 19, such as the well-known balanced colliding pulse mode-locked (CPM) dye laser or a passively mode-locked titanium doped sapphire laser, and are directed into the sampling apparatus via a microscope objective 21. Probe 14 is mounted optically (not physically) between crossed polarizers 22 and 23 and below a dichroic beam splitter 24 in such a way as to facilitate viewing of the end face of the probe from above via a microscope system 25. Incoherent white light is injected from an illumination source 26 through beam splitter 24 to illuminate the conductor below the probe. In this way, both the conductor and the sampling beam spot can be seen together. Quartz compensating plates 27 are included between polarizers 22 and 23 to operate the e-o crystal at a "zero-order" quarter wave point. Polarizer 23, which is a polarizing analyzer, is used to separate orthogonal polarizations and direct the output to dual differential light detectors 28 and 29. The detector output is then fed to a lock-in amplifier and signal averager, 30. The probe is then brought down to any suitable point on or above substrate 13 for sampling the voltage waveform of a selected conductor.

A voltage waveform may be generated on the conductor by coupling a test signal thereto (or to the circuit of which it is a pan) either electrically via a suitable (e.g. high-speed) electrical connection 31 or optically via optical delay line 32 coupled to a photodetector (not shown) on substrate 13. In either case, well-known sampling techniques are utilized so that the optical pulses and the waveform being measured are synchronized, and the optical pulses are scanned across the waveform to be sampled.

In operation, polarized beam 17 is illustratively used to sense change in the birefringence induced in the e-o crystal. When the conductor being measured has zero voltage on it, then the reflected beam (immediately before polarizer 23) has orthogonal polarization components which are 90 degrees out of phase with one another. These components are separated by the polarizing analyzer (polarizer 23) and generate equal signals (balanced outputs) from detectors 28 and 29. However, when the voltage on the conductor is not zero, the birefringence induced in the crystal is changed, and an additional phase shift is produced between the two orthogonal components; i.e., the reflected beam is elliptically polarized, resulting in an imbalanced output from detectors 28 and 29 and a signal from lock-in amplifier/averager 30 which is proportional to the voltage on the conductor.

Typically, the prior-art crystal probe 15 comprises a relatively thick slice of $LiTaO_3$, e.g., about 100 $\mu m$ thick, and the support 16 is a transparent material such as fused silica rod bonded to the probe. The probe and a portion of the rod adjacent to the $LiTaO_3$ slice are polished as a four-sided pyramid having a half angle of about 30 degrees with the end face of the probe being 200 $\mu m$ or less on a side. Deviations from 30° result in reduced facet reflectivities. The optic axis of the $LiTaO_3$ is essentially perpendicular to the end face of the probe. If needed, an optional high reflecting (HR) coating 18 (FIG. 6) may be evaporated onto the end face of the probe so that the sampling beam can be reflected directly back to the optical system without reflecting of the side facets. Microscope objective 21 is used both to focus the sampling beam onto the end face of the probe and to recollimate the reflected beam.

Conductors 12 on substrate 13 (i.e., the circuit) are energized via either a waveform synthesizer (not shown) coupled to high-speed connection 31 and synchronized with the laser or vice-versa by frequency locking the laser to a master RF source or via an electrical signal from a photodetector (not shown) illuminated by the laser pulses from delay line 32. Electrical connections to the circuit may be made by conventional probes, a probe card, or wire bonding. Relative delay between trigger and sampling times is introduced by the motor driven optical delay line 32, although purely electronic means, in some cases, can also be utilized. Utilizing apparatus of this type with optical pulses of about 100 fs duration, it is expected that measurement bandwidths in excess of 1 THz (1000 GHz) can be attained.

The measured electrical rise times are often longer than the optical pulses. This difference is due in part to the distance the electrical signal must travel from the excitation site to the sampling site, and in part to the distance the optical sampling pulse must travel through the LiTaO$_3$ sampling crystal. As the electrical pulse travels along the transmission line it is dispersed, resulting in preferential attenuation and radiation of the high frequency components. As the optical pulse travels in the LiTaO$_3$ crystal it propagates with the electrical pulse, but at a different velocity. This results in velocity walk-off, causing the detected signal to appear longer. This walk-off effect becomes enhanced as the crystal thickness is increased.

SUMMARY OF THE INVENTION

This invention embodies a new electro-optic sampling probe with femtosecond resolution suitable for ultra-fast electro-optic sampling. The new probe is several times thinner and has a dielectric constant four times less than the best reported conventional bulk LiTaO$_3$ probes. In addition, the ultimate bandwidth is 50 percent greater than an equivalent LiTaO$_3$ probe. The probe is a thin film of Al$_x$Ga$_{1-x}$As used in both total internally reflecting and free-standing geometries. Here x is chosen for sufficient transmission of the crystal to the wavelength of the laser source being used for electro-optic sampling. The thickness of the film is a small fraction of the thickness of prior an probes and is chosen, for speed and sensitivity of electro-optic sampling, to be thin compared to the spatial extent of the laser pulse. The thin film probe eliminates many of the problems associated with the use of bulk crystals as electro-optic sensors.

DETAILED DESCRIPTION

Figure 1:
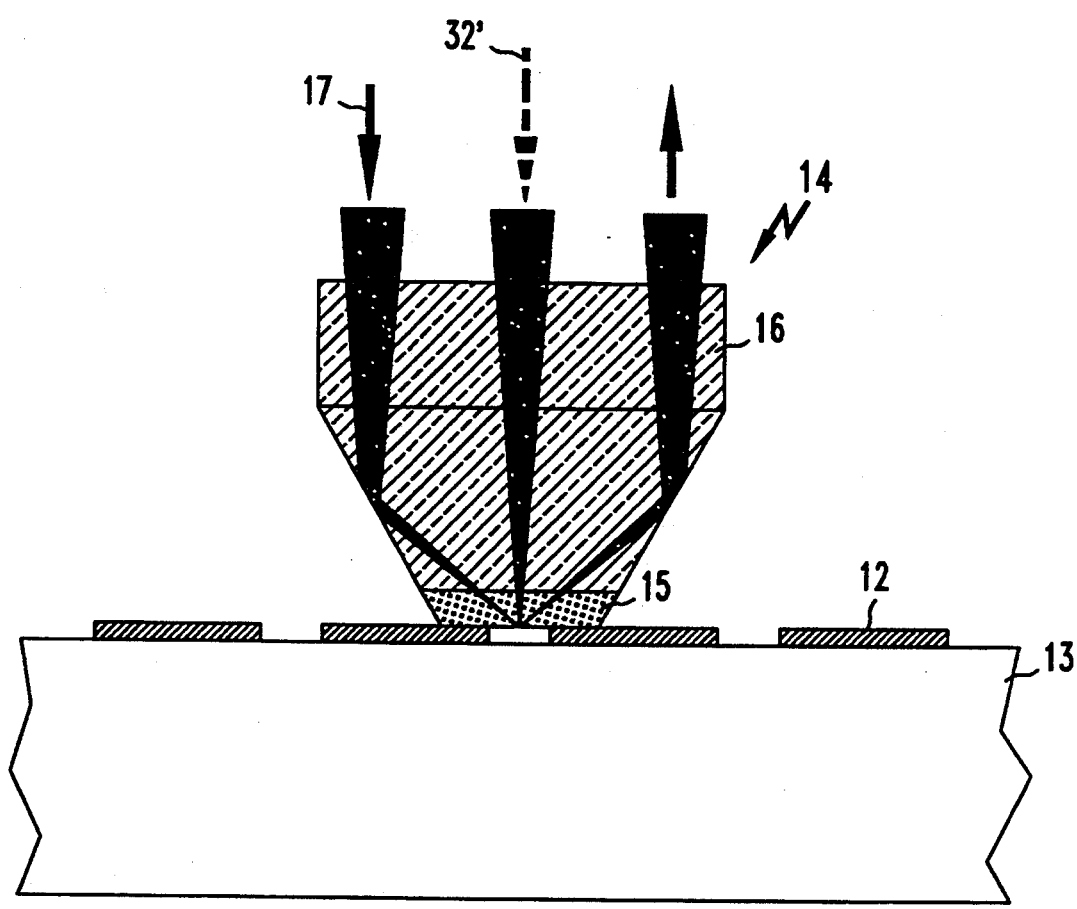
FIG. 1 is a schematic representation of AlGaAs crystal probe and total internal reflection geometry, with both sensing and excitation beams passing through the probe.

This invention embodies an electro-optic crystal probe for use with the e-o sampling system of the type described above. The probe may be utilized as a crystal film supported on a transparent rod (FIGS. 1 and 3) or as a free-standing probe (FIG. 4). In each instance, the probe consists of a thin Al$_x$Ga$_{1-x}$As layer (hereinafter referred to as AlGaAs). Here, x is that fraction of Al in the AlGaAs crystal which is needed for sufficient transmission of the crystal to the wavelength of the laser source being used in the electro-optic sampling. The crystal probe is much thinner than the spatial extent of the optical pulse of a laser being used. For example, if a wavelength of a 100 fs optical pulse is 30 $\mu$m long in air, the thickness of the probe is selected to be thinner than this wavelength.

For illustration purposes, various dimensions in the drawings are drawn not to scale. Also, the same numerals have been used to denote the same or similar components of the drawings.

Figure 8:
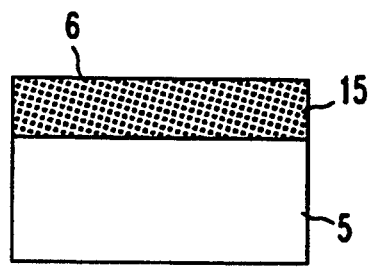
FIG. 8 is a schematic representation of a thin Al$_x$Ga$_{1-x}$As crystal deposited upon a GaAs substrate.

The crystal probe is fabricated using molecular beam epitaxy (MBE) to achieve an active layer which is thinner and more uniform than that achievable through polishing of bulk (e.g., LiTaO$_3$) crystals. The probe was grown as a thin layer or film of AlGaAs, 15, on a (110) GaAs substrate wafer 5, by molecular beam epitaxy see FIG. 8. Use of (110) GaAs substrate 5 places the optical axis in the plane of the wafer. Layer 15 is then removed from the substrate using selective etches. The thickness of probe layer 15 is chosen to be thinner than the spatial extent of the optical pulse of a laser being used. For a CPM laser, with a spatial extent of the laser pulse $\approx 30$ $\mu$m, the thickness, t, of the probe layer may be within a range of $5 < t < 27$ $\mu$m. Preferably the probe layer is about 7 $\mu$m thick. Thicker crystals can be fabricated by either MBE or other epitaxial growth techniques such as Liquid Phase Epitaxy. Thinner crystals are limited only by the fragility of the crystal during processing. The Al content, or required band gap energy of the active layer, is determined by the wavelength of the particular laser source used. For the case of the CPM laser, this laser requires the use of Al$_{0.8}$Ga$_{0.2}$As. On the other hand, a passively mode-locked titanium doped sapphire laser source would require less Al, since it operates at a longer wavelength. The requirement for a particular application is the relative absorption at the wavelength of the laser source being used. The same technique of band gap engineering can be used for other III/V material systems, such as InP, and also for II/IV materials systems, such as CdS, since all of these materials have birefringent properties. The same crystalline layer may be fabricated into total internal reflecting geometries (either critical angle type, or through the use of a high reflective coating) or free-standing geometries.

Figure 9:
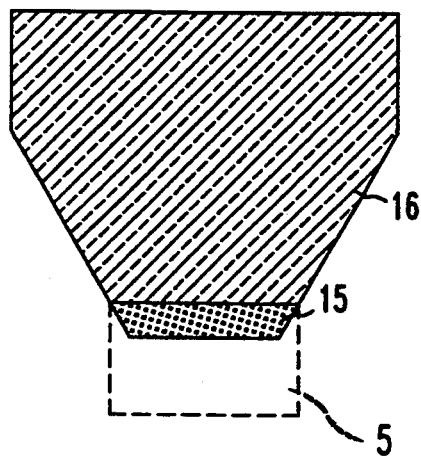
FIG. 9 is a schematic representation of the thin crystal, shown in FIG. 8 but without the substrate, mounted on a truncated support.

The supported probe 14 shown in FIG. 1 was prepared by gluing a small piece of GaAs wafer 5 with a thin AlGaAs layer 15 thereon (shown in FIG. 8) to a glass rod or block 16 so that a free, top surface, 6, of the AlGaAs layer forms a glass/AlGaAs interface. Thereafter the probe and the adjacent end portion of the rod are polished to a pyramidal shape, such that the glass/AlGaAs interface is of an appropriate size (see FIG. 9). By appropriate size is meant a size of the probe constrained by the visual limitations of the microscope to be used in the sampling measurement, i.e., the AlGaAs crystal and the adjacent facets of the support rod must all be within the field of view if the sampling beam is to be routed as shown in FIG. 1. For a 20x objective (Mituoyo ULWD), the interface is of the order of $\approx 200$ μm or less on a side. The GaAs substrate 5 is then etched away leaving the thin AlGaAs layer 15 attached to the glass support. This technique produces thinner crystal wafers, with better interface planarity than conventional polishing. A flat bottom element allows the probe to be interferometrically aligned on the sample. Parallelism on the order of a single fringe is routinely achieved. This fabrication technique enables the production of a Total Internal Reflection (TIR) probe geometry, which does not require the high reflection coating.

Figure 2:
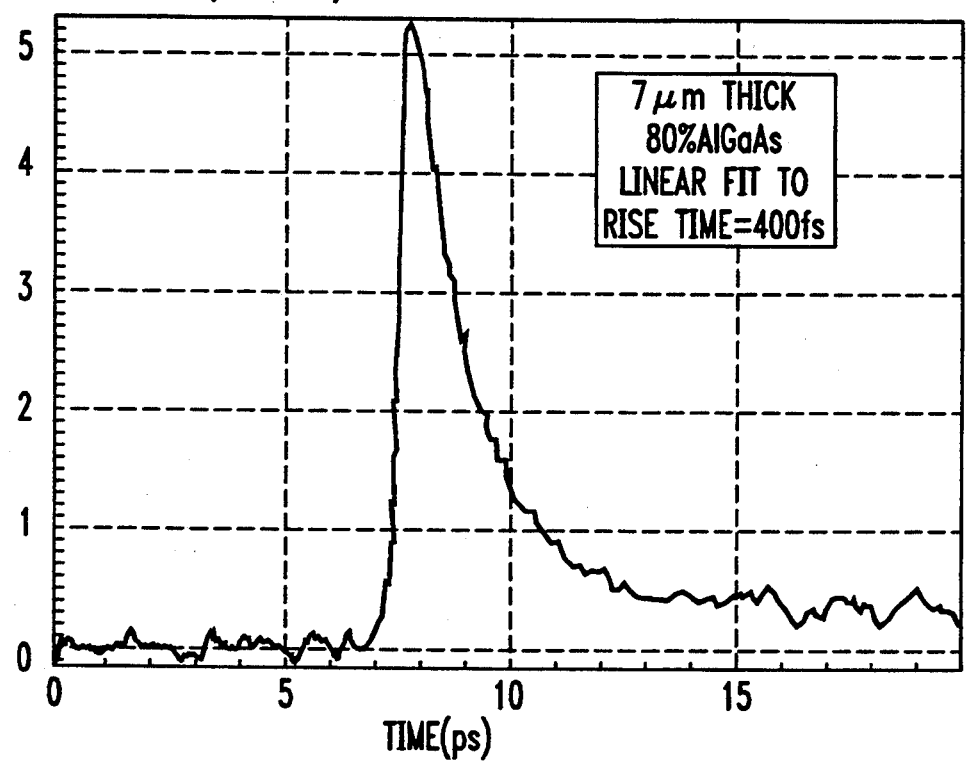
FIG. 2 is an electro-optically sampled data for AlGaAs using total internal reflection geometry; the linear fit to the rise time (10-90 percent) being 400 fs.
Figure 6:
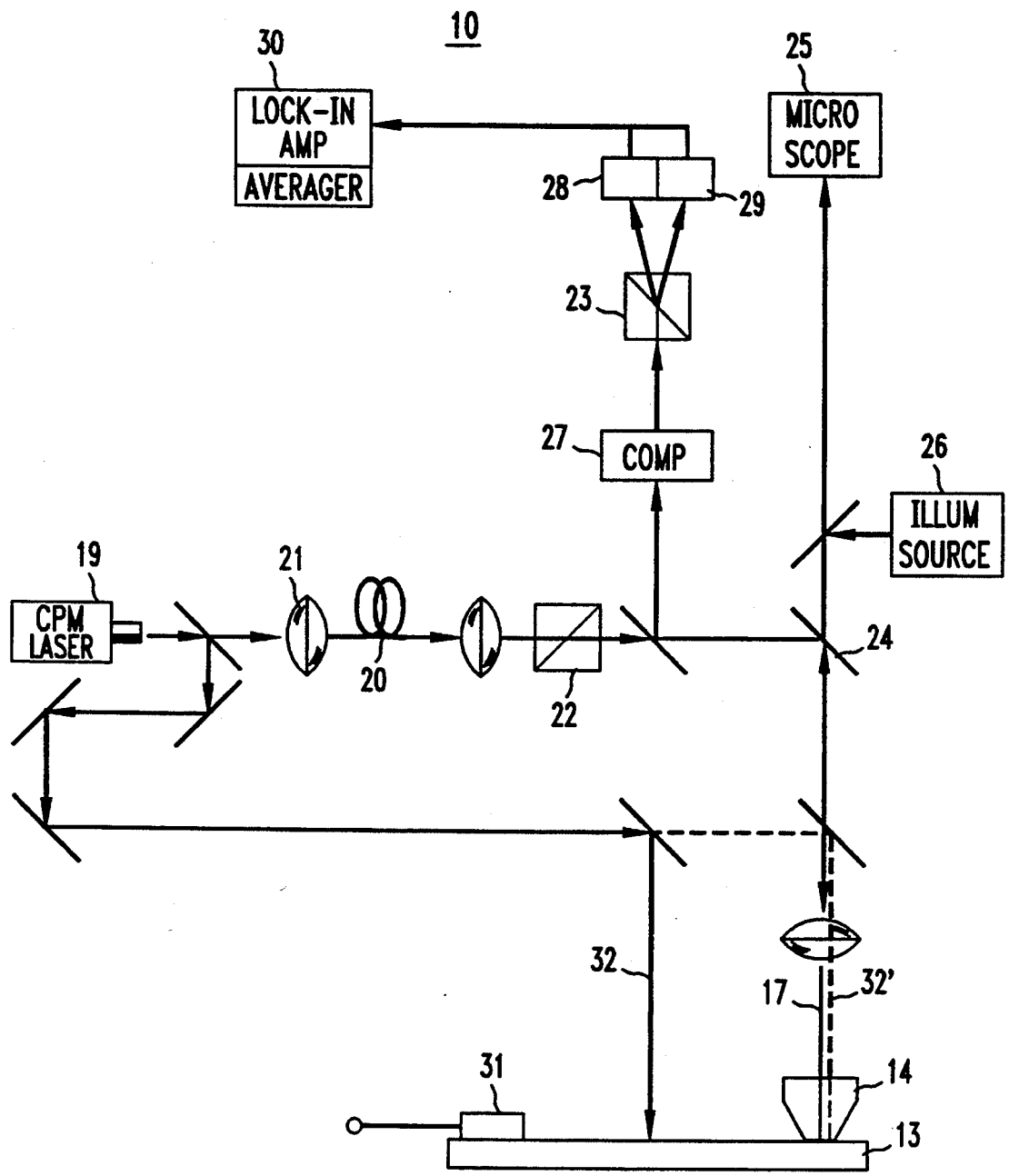
FIG. 6 is a schematic representation of a prior-an apparatus for use in making voltage measurements on ICs.
Figure 7:
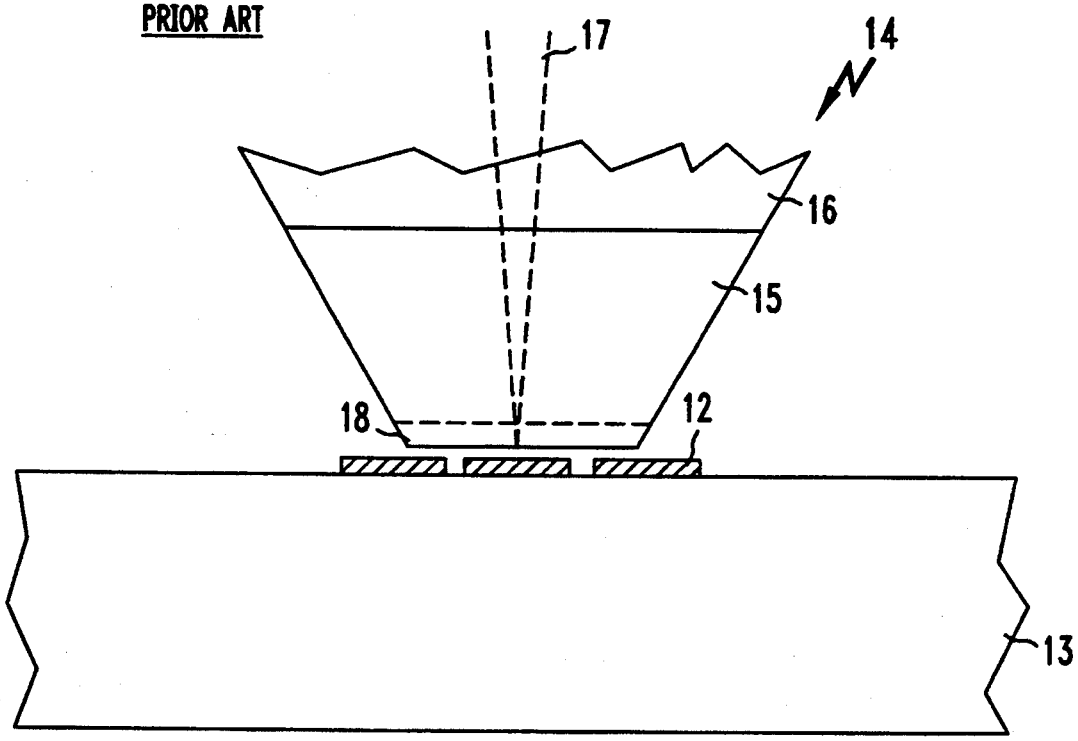
FIG. 7 is a schematic representation of a typical prior-an e-o voltage sampling probe for use with the apparatus of FIG. 6.

The electrode geometry is a coplanar strip transmission line with 5 μm lines and spacings. The TIR geometry consisted of a simple multi-line system with no contact pads within the time window. Probe 15 was used on samples on LT-GaAs substrates producing electrical pulses ~1 ps FWHM. Sampling beam 17 is directed so that it impinges upon a facet of the pyramid, is directed to a point in crystal probe 15, and is reflected toward the microscope objective 21. In this instance excitation beam 32' is directed as is shown in dashed lines in FIG. 6 and impinges at about the same point as the sampling beam. FIG. 2 shows the measured response. A linear lit to tile rise time (10–90 percent) in FIG. 2 is ~400 fs.

Figure 3:
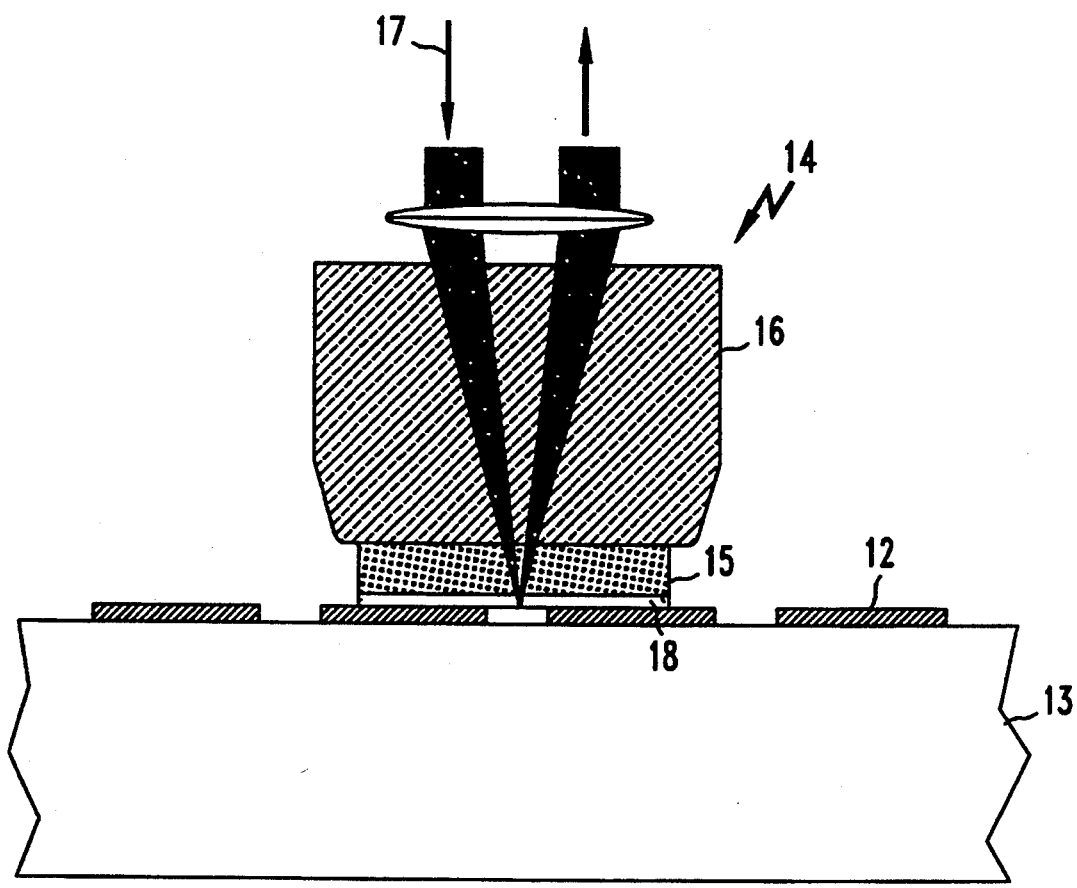
FIG. 3 is a schematic representation of AlGaAs crystal probe and total internal reflection geometry, with probe provided with a highly reflective coating facing the sample circuit and with only sensing beam passing through the probe.
Figure 4:
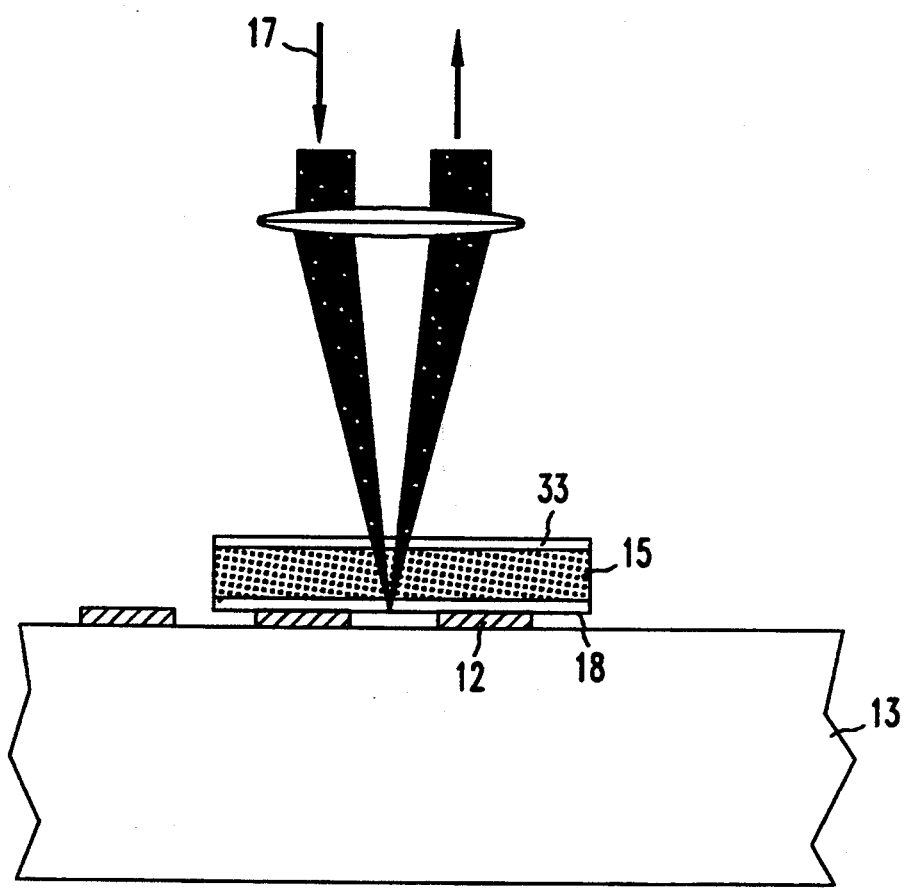
FIG. 4 is a schematic representation of a free-standing crystal probe according to the invention.
Figure 5:
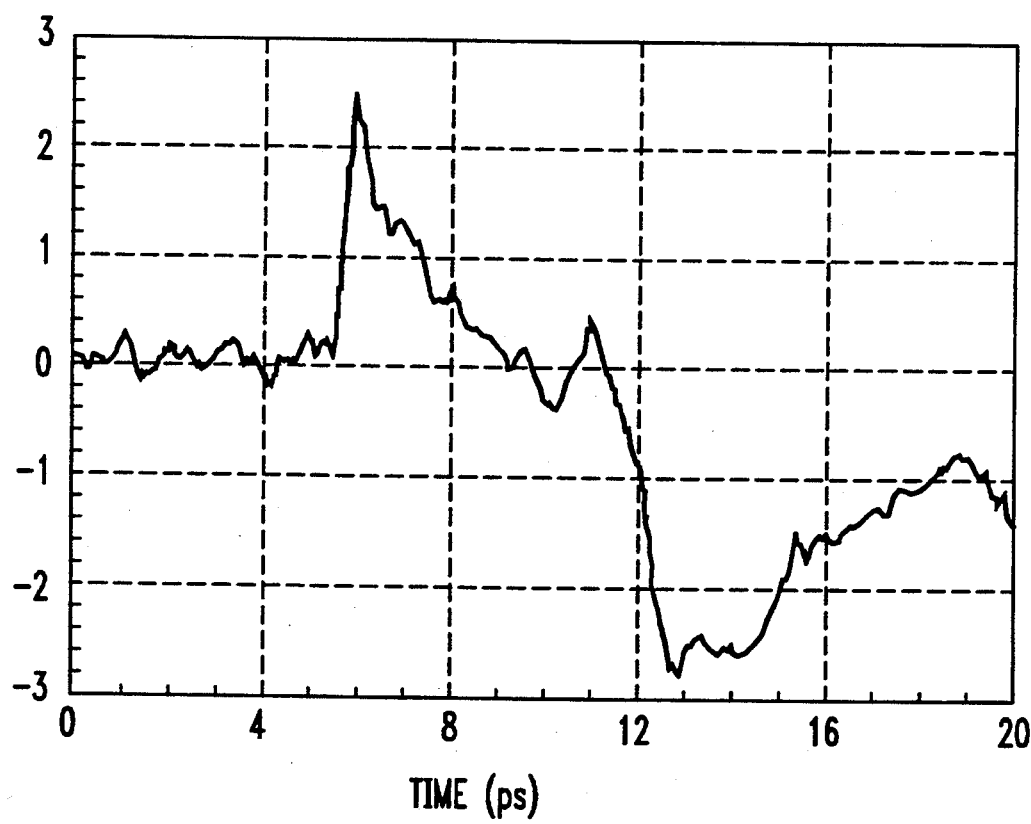
FIG. 5 is an electro-optically sampled data for AlGaAs using the freestanding probe geometry.
Figure 10:
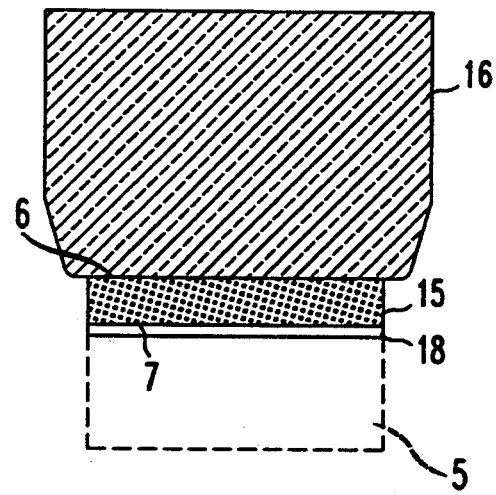
FIG. 10 is a schematic representation of the thin crystal, shown in FIG. 8 but without the substrate, mounted on a rod-like support and provided with an anti-reflection coating.

In FIG. 3 is shown a variant of supported probe 14. In this instance 9 free surface 7, of crystal probe 15 supported on rod 16 is coated with an HR coating, 18; however, the sides of the support rod and the crystal probe do not need to be shaped. Surface 7 becomes free after crystal probe 15 is secured on rod 16 and the GaAs layer 5 is removed (FIG. 10). In this instance excitation beam 32' does not need to pass through the crystals as was the case in FIG. 1, but may be directed at a different portion of the circuit.

Figure 11:
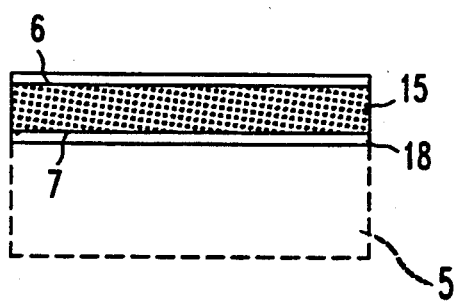
FIG. 11 is a schematic representation of the thin crystal, shown of FIG. 8 but without the substrate, provided with a high-reflective coating and with an anti-reflection coating.

In FIG. 4 is shown an arrangement with a free-standing probe, 31. The probe is approximately 7 μm thick and is provided with an Anti-Reflectivity (AR) coating, 33, which is applied to the top surface 6 of the probe and a High-Reflectivity (HR) coating, 18, applied to the bottom surface 7 of crystal probe 15 (see FIG. 11). In this arrangement, the sampling beam is reflected from the HR coating. The excitation beam 32 (not shown) is 2–3 optical beam diameters away from sampling beam 17, resulting in a propagation distance of approximately 15 μm. The reflections are assumed to be caused by nearby contact pads.

This probe is produced by growing an AlGaAs film 15 on a GaAs substrate wafer 5 (see FIG. 8), in the manner similar to tile growth of the probe for the variant shown in FIG. 1. However, here the top surface 6 of the AlGaAs film is AR coated, and the substrate is then chemically removed using a preferential etch which produces large area ($\approx 1$ cm$^2$) free-standing films. HR coating, 18, is applied to back or bottom surface of the AlGaAs film, which is the lateral plane of the film opposite to the AR-coated side. If a particular HR coating used does not produce a high reflectivity, an Au electrode on the sample may be used as an additional mirror. This may be accomplished simply by moving the probe so that sampling beam 17 is over the surface of electrode 12. For the free-standing film measurement, an in-line photoconductive switch with a 5 μm gap is located 100 μm from a side sampling gate. The side sampling gate is the third electrode shown in FIG. 4, grounded in this configuration. This makes the coplanar transmission line look like a three-line system at the sampling site.

Table 1 of the Appendix shows a comparison of physical constants of AlGaAs and of other probe materials typically used for fast electro-optic sampling (LiTaO$_3$ and GaAs). In addition to the half wave voltage sensitivity, the dielectric constant of LiTaO$_3$ is very large, resulting in large signal dispersion for any significant propagation distance inside the crystal. While GaAs has a better voltage sensitivity than LiTaO$_3$, it cannot be used with most femtosecond laser systems (the band edge of GaAs is >850 nm). The AlGaAs probe offers a reasonable electro-optic coefficient, but has a lower dielectric constant than either LiTaO$_3$ or GaAs. The probe used in this work is AlGaAs (80 percent Al), to minimize oxidation which takes place with pure AlAs. At this Al content, optical excitation is indirect. The refractive index, n($\lambda$=620 nm) for AlGaAs is about 3.4. The static dielectric constant, $\epsilon_s$, for GaAs is equal to 13.18, for AlAs is equal to 10.06, and, for Al$_x$Ga$_{1-x}$As, it is given by a linear interpolation between GaAs and AlAs $$\epsilon_s = 13.18 - 3.12x \quad (1)$$

For (x=0.8), $\epsilon_s$=10.68. Compared with LiTaO$_3$ probes, the new probe is 5 to 100 times thinner and the corresponding dielectric constant is four times smaller ($\epsilon_0$=43 for LiTaO$_3$). Note that for small line dimensions the electric field falls off exponentially on the order of the line spacing, so that a thinner probe is not necessarily much less sensitive than a thicker one.

To estimate the ultimate bandwidth of this probe, one should compare the relevant resonance frequencies shown in Table 1. LiTaO$_3$ has a vibrational resonance at 6.3 THz and Al$_x$Ga$_{1-x}$As, with x=0.8, has a transverse optical (TO) phonon (AlAs Type) at $$44.63 + 0.55x - 0.3x^2 \quad (2)$$

where x is the fraction of Al. For 80 percent Al, the TO phonon is 45.26 meV or 10.86 THz. The corresponding TO phonon in GaAs is 8.032 THz. The half wave voltage, $V^{unit\pi}$, is the voltage per unit length that must be applied to a given modulator to retard the signal by $\pi$ radians and can be found from:

$$V^{unit\pi} = \frac{\lambda}{n^3 r_{ij}} \quad (3)$$

where n is the index of refraction. $r_{ij}$ is the appropriate electro-optic tensor element, and $\lambda$ is the free space optical wavelength. Equation (3) is calculated in Table 1 for all three materials. Using a value for the electro-optic coefficient of GaAs at 0.9 μm, AlGaAs is expected to be ten times less sensitive than an equivalent LiTaO$_3$ modulator. However, because of the shorter operating wavelength (0.62 vs. 1.0 μm), of the AlGaAs crystal with 80 percent Al, AlGaAs is almost twice as sensitive as an equivalent GaAs modulator. The shorter propagation distance inside the crystal makes the total sensitivity less for a thinner crystal, as the integrated polarization change is a function of modulator length. High frequency detection techniques make sensitivity a less important issue for sampling applications of these modulators. Similar calculations and considerations may be applied to AlGaAs crystal probes with other than 0.8.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

TABLE 1
APPENDIX

| Material | Index, n | Electro-optic Coefficient, $r_{ij}$ ($\times 10^{-12}$ m/V) | $V_\pi^{unit} = \dfrac{\lambda}{n^3 r_{ij}}$ (kV) | Resonance Frequency (THz) | Static Dielectric Constant, $\epsilon_0$ |
|---|---|---|---|---|---|
| LiTaO$_3$ | $n_0 = 2.175$ (at 0.55 μm) | $r_{33} = 30.3$ | 1.8 | 6.3 (vibrational) | 43 |
| GaAs | $n_0 = 3.6$ (at 1.0 μm) | $r_{41}^{GaAs} = 1.2$ | 25.7 | 8.032 (TO Phonon) | 13.18 |
| 80% AlGaAs | $n_0 \sim 3.4$ (at 0.62 μm) | $r_{41}^{GaAs} = 1.2$ | 13.1 | 10.86 (TO Phonon) | 10.68 |

We claim:

1. An electro-optic probe for use in electro-optic sampling of electronic and opto-electronic circuits, which comprises a crystal which exhibits longitudinal electro-optical effect, said crystal is a thin film comprising Al$_x$Ga$_{1-x}$As wherein x is chosen for sufficient transparency to a laser source being used in the electro-optic sampling, and the thickness of said film is chosen to be thin compared to a spatial extent of the laser pulse of said laser source.

2. The probe of claim 1, in which the laser source is a CPM dye laser with a spatial extent of the laser pulse $\approx 30$ μm, said x is 0.8, and said probe crystal is $5 < t < 27$ μm thick, wherein t is the thickness of the probe crystal.

3. The probe of claim 1, in which said probe is a supported probe, one plane surface of which is attached at an end portion of a support bar.

4. The probe of claim 3, in which the said end portion of the support bar and the probe crystal are shaped in a form of a truncated pyramid.

5. The probe of claim 4, in which an interface of the support bar and of the probe crystal is of the order of 200 μm or less on a side.

6. The probe of claim 3, in which an unattached plane surface of the probe crystal is coated with a high-reflective coating.

7. The probe of claim 1, in which said probe crystal is a freestanding probe.

8. The probe of claim 7, in which said probe crystal is provided with an anti-reflective coating and a high-reflective coating on the opposite plane surfaces of the thin film, the high-reflective coating being on the surface intended to face the circuit to be electro-optically sampled.

9. An electro-optic probe for use in electro-optic sampling of electronic and opto-electronic circuits, which comprises a crystal which exhibits longitudinal electro-optic effect, said crystal is a thin film comprising Al$_x$Ga$_{1-x}$As wherein x is chosen for sufficient transparency to a laser source being used in the electro-optic sampling, the thickness of said film is chosen to be thin compared to a spatial extent of the laser pulse of said laser source, said probe is a supported probe one plane surface of which is attached at an end portion of a support bar, and an unattached plane surface of the probe crystal is coated with a high-reflective coating.

10. The probe of claim 9, in which said laser source is a CPM dye laser with a spatial extent of the laser pulse $\approx 30$ μm, said x is 0.8, and said probe crystal is $5 < t < 27$ μm thick, wherein t is the thickness of the probe crystal.

11. The probe of claim 9, in which said end portion of the support bar and the probe crystal are shaped in a form of a truncated pyramid.

12. The probe of claim 11, in which an interface of the support bar and of the probe crystal is of the order of 200 μm or less on a side.

13. An electro-optic probe for use in electro-optic sampling of electronic and opto-electronic circuits which comprises a crystal which exhibits longitudinal electro-optic effect, said crystal is a thin film comprising Al$_x$Ga$_{1-x}$As wherein x is chosen for sufficient transparency to a laser source being used in the electro-optic sampling, the thickness of said film is chosen to be thin compared to a spatial extent of the laser pulse of said laser source, said probe crystal is a freestanding probe, and said probe crystal is provided with an anti-reflective coating and a high-reflective coating on the opposite plane surfaces of the thin film, the high-reflective coating being on the surface intended to face the circuit to be electro-optically sampled.

14. The probe of claim 13, in which the laser source is a CPM dye laser with a spatial extent of the laser pulse $\approx 30$ μm, said x is 0.8 and said probe crystal is $5 < t < 27$ μm thick, wherein t is the thickness of the probe crystal.

* * * * *